US010955881B2

(12) United States Patent
Gopalakrishna et al.

(10) Patent No.: US 10,955,881 B2
(45) Date of Patent: Mar. 23, 2021

(54) MEMORY MODULE COOLING ASSEMBLY

(71) Applicant: Seagate Technology, LLC, Cupertino, CA (US)

(72) Inventors: Shankar Gopalakrishna, Bangalore (IN); Vivekananda Avvaru, Bangalore (IN); Saju Cheeran Verhgese Francis, Bangalore (IN)

(73) Assignee: Seagate Technology LLC, Fremont, CA (US)

( * ) Notice: Subject to any disclaimer, the term of this patent is extended or adjusted under 35 U.S.C. 154(b) by 44 days.

(21) Appl. No.: 15/584,741

(22) Filed: May 2, 2017

(65) Prior Publication Data

US 2018/0321715 A1 Nov. 8, 2018

(51) Int. Cl.
*G06F 1/20* (2006.01)
*H01L 23/40* (2006.01)
*G06F 1/18* (2006.01)
*H01L 23/02* (2006.01)
*H01L 23/367* (2006.01)
*F28D 15/00* (2006.01)

(52) U.S. Cl.
CPC ............... *G06F 1/20* (2013.01); *G06F 1/187* (2013.01); *H01L 23/02* (2013.01); *H01L 23/4093* (2013.01); *F28D 15/00* (2013.01); *H01L 23/3672* (2013.01)

(58) Field of Classification Search
CPC . G06F 1/20; G06F 1/187; H01L 23/02; H01L 23/4093; H01L 23/3672; F28D 15/00
USPC ........................................................ 361/720
See application file for complete search history.

(56) References Cited

U.S. PATENT DOCUMENTS

| 5,966,287 | A | 10/1999 | Lofland et al. |
| 6,353,538 | B1 * | 3/2002 | Ali ...................... H01L 23/3675 174/252 |
| 6,483,702 | B1 | 11/2002 | Lofland |
| 6,633,485 | B1 * | 10/2003 | Sigl ..................... H01L 23/4093 257/727 |
| 6,765,797 | B2 | 7/2004 | Summers et al. |
| 7,187,552 | B1 | 3/2007 | Stewart et al. |
| 7,391,613 | B2 | 6/2008 | Lai et al. |
| 7,483,273 | B2 | 1/2009 | Uehara et al. |
| 7,619,893 | B1 | 11/2009 | Yu |
| 7,755,897 | B2 | 7/2010 | Chen et al. |
| 7,920,383 | B2 | 4/2011 | Yang et al. |
| 7,957,134 | B2 | 6/2011 | Farnsworth et al. |
| 8,081,474 | B1 * | 12/2011 | Zohni ................... H01L 23/367 257/719 |
| 8,154,873 | B2 | 4/2012 | Lian et al. |
| 2003/0011995 | A1 * | 1/2003 | Liang ................. H01L 23/4093 361/704 |

(Continued)

*Primary Examiner* — Anatoly Vortman
*Assistant Examiner* — Zhengfu J Feng
(74) *Attorney, Agent, or Firm* — Hall Estill Attorneys at Law

(57) ABSTRACT

An electronic memory module can be cooled by a cooling assembly that consists of at least a printed circuit board connected to at least one data storage component. The memory module may be housed within, and in physical contact with, a cooling frame that surrounds a periphery of the printed circuit board. The cooling frame can have a seating tab that is separated from the memory module, spans the memory module, and supports a heatsink in contact with the at least one data storage component.

18 Claims, 8 Drawing Sheets

(56) References Cited

U.S. PATENT DOCUMENTS

| | | | | |
|---|---|---|---|---|
| 2004/0052046 | A1* | 3/2004 | Regimbal | G06F 1/184 |
| | | | | 361/679.33 |
| 2004/0233645 | A1* | 11/2004 | Chen | G06F 1/1632 |
| | | | | 361/737 |
| 2004/0252461 | A1* | 12/2004 | Wu | H01L 23/4093 |
| | | | | 361/704 |
| 2008/0038877 | A1* | 2/2008 | Wang | G06F 12/1416 |
| | | | | 438/125 |
| 2008/0084664 | A1* | 4/2008 | Campbell | G06F 1/20 |
| | | | | 361/699 |
| 2008/0212297 | A1* | 9/2008 | Ni | G06F 12/1416 |
| | | | | 361/760 |
| 2009/0205197 | A1* | 8/2009 | Kreissig | H01L 23/4006 |
| | | | | 29/739 |
| 2010/0157539 | A1* | 6/2010 | Wang | H01L 23/4093 |
| | | | | 361/709 |
| 2011/0310565 | A1 | 12/2011 | He | |
| 2012/0162919 | A1 | 6/2012 | Lin | |
| 2017/0179642 | A1* | 6/2017 | Lin | H01R 12/73 |

* cited by examiner

MEMORY MODULE COOLING ASSEMBLY

SUMMARY

A memory module, in accordance with some embodiments, has a printed circuit board physically attached to at least one data storage component. The memory module is housed within, and in physical contact with, a cooling frame that surrounds a periphery of the printed circuit board. The cooling frame has a seating tab that is separated from the memory module, spans the memory module, and supports a heatsink in contact with the at least one data storage component.

In other embodiments, a memory module has a printed circuit board physically attached to first and second data storage components. The memory module is housed within, and in physical contact with, a cooling frame that surrounds a periphery of the printed circuit board. The cooling frame has a seating tab that is separated from the memory module, spans the memory module, and supports a first heatsink in contact with the first data storage component on a first side of the memory module. A flexible tab extends from the cooling frame to force a second heatsink in contact with the second data storage component on a second side of the memory module.

A first heatsink, in other embodiments, is positioned within a cooling frame and supported by a seating tab of the cooling frame that spans a memory module. The memory module contacts the first heatsink by tilting the memory module at a non-normal angle with respect to the cooling frame prior to inserting the memory module into the cooling frame and then rotating the memory module towards the first heatsink. The cooling frame is configured to surround and contact a periphery of a printed circuit board of the memory module to limit movement of the first heatsink and memory module along perpendicular axes.

DETAILED DESCRIPTION

As electronic components, such as processors and solid-state data memory, have increased in computing power, greater amounts of heat are created during operation. Elevated heat levels can be temporarily, and permanently, damaging to the performance of the individual electronic components as well as the data storage system employing those components. In the past, memory modules that consisted of data storage components were restricted to particular form factors, physical constraints, and connectivity.

Recently, memory modules have evolved to standard configurations, such as M.2 module, that allows for flexibility and relatively sophisticated computing capabilities compared to predecessor memory module configurations. However, cooling assemblies that were adapted to universally fit a variety of module arrangements tend to be cumbersome with a variety of different parts that must be managed and handled to properly provide cooling capabilities to a memory module employing a standard configuration.

Figure 1:
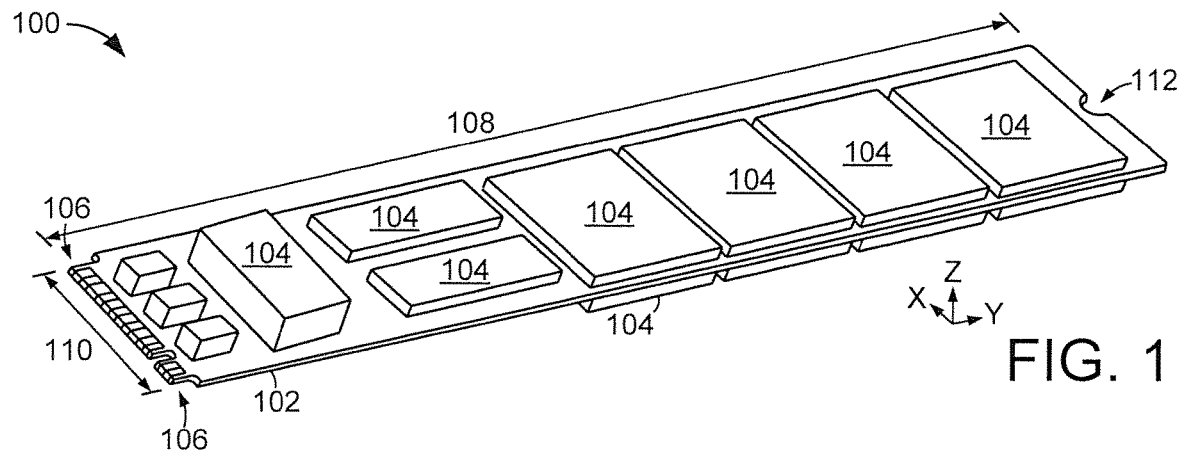
FIG. 1 is a line representation of an example memory module that can be incorporated into a cooling assembly in accordance with some embodiments.

Accordingly, various embodiments are directed to a cooling assembly that allows for efficient installation, removal, and replacement while providing optimized cooling for a memory module. FIG. 1 is a line representation of an example memory module 100 that may be utilized in a cooling assembly in accordance with some embodiments. The memory module 100 has a printed circuit board (PCB) 102 that physically supports a variety of separate electrical components 104 as well as electrical pathways that interconnect the components 104 with one another and/or with external device(s) via an input/output (I/O) edge connector 106.

The PCB 102 can be any size and shape that is defined by a length 108 and width 110, but in some embodiments is a standard configuration, like a mini-SATA or M.2. In the non-limiting M.2 configuration shown in FIG. 1, the PCB 102 has a semi-circular key region 112 that can orient the edge connector 106 and PCB 102 with respect to external structures. It is noted that the electrical components are positioned on two opposite sides of the PCB 102, which provides greater data storage capacity and computing power, but results in larger amounts of heat that is thermally challenging to cool. The position of electrical components 104 on two sides of the PCB 102 also presents a challenge for universal-fit heatsink assemblies that clamp or apply pressure on one side of the PCB 102 more than the other.

It can be appreciated that some type of cooling means is needed for any long-term operation of the electrical components 104 and the M.2 standard configuration is not designed to accept heatsinks or heatsink clips. Thus, it is necessary to have a heatsink attached to an M.2 memory module before installation into a computing system, such as a motherboard or interface card. However, the flexibility of the M.2 standard configuration to allow electrical components 104 of diverse types with assorted sizes and positions on the PCB 102 makes universal-fit cooling assemblies difficult. Accordingly, assorted embodiments provide a cooling assembly that fits any standard configuration memory module, such as, but not limited to, the M.2 configuration, without making any custom modifications to the module itself.

Figure 2A:
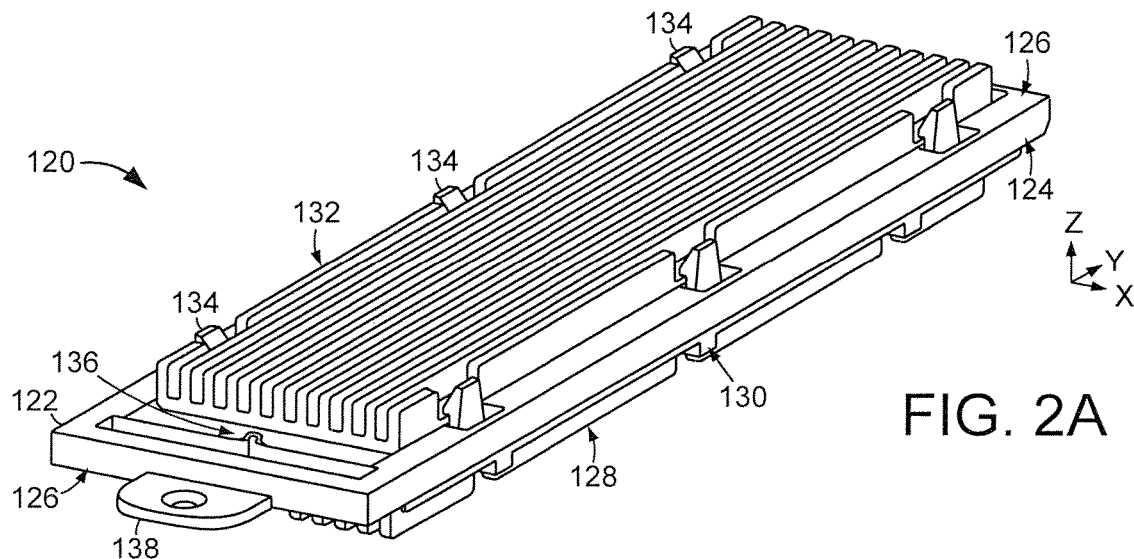
FIGS. 2A & 2B respectively display example memory module cooling assemblies configured in accordance with various embodiments.
Figure 2B:
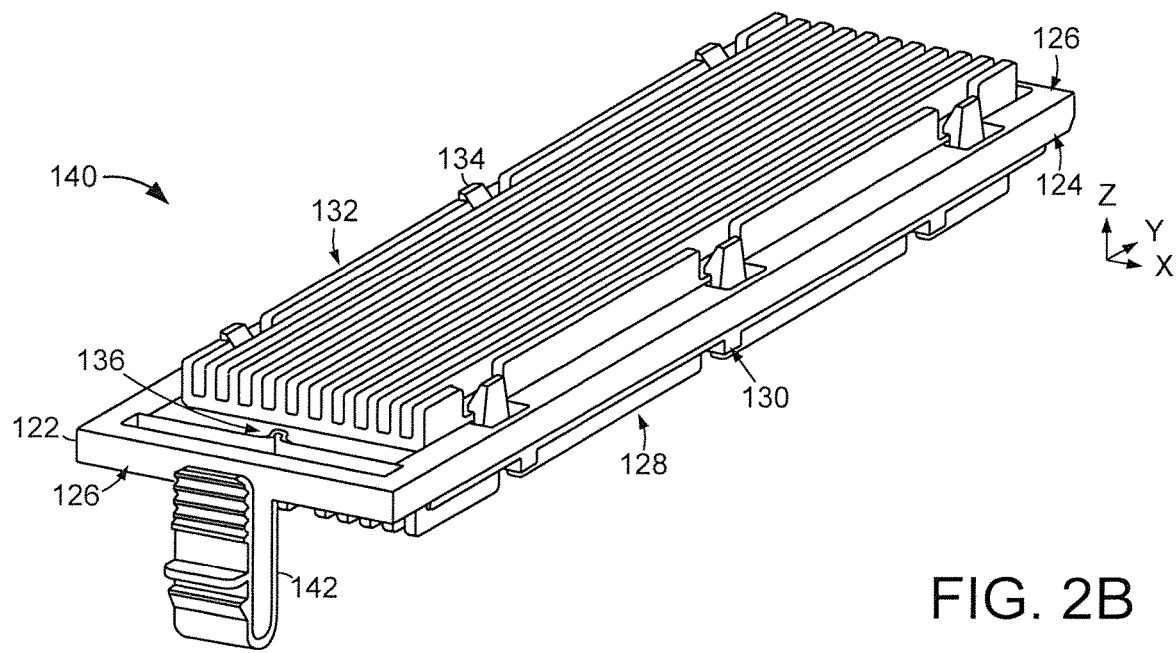

FIGS. 2A and 2B respectively display example memory module cooling assemblies 120 and 140 that can be installed and utilized by hand and without any tools. It is to be understood that the term tool-less is meant to convey that the cooling assembly can be installed, uninstalled, assembled, and de-assembled via hand manipulation of a user without extraordinary strength, flexibility, or the use of a tool, such as pliers or a screwdriver.

Each cooling assembly 120/140 has a cooling frame 122 that has at least one side rails 124 continuously extending between end rails 126. The cooling frame 122 supports a bottom heatsink 128 with at least one seating tab 130 and supports a top heatsink 132 via at least one flexible tab 134. The cooling frame 122 has a keyed feature 136 that engaged a shaped recess in the memory module, such as key region 112 of FIG. 1, which positions and secures the memory module within the cooling frame 122.

In FIG. 2A a fastener feature 138 is cantilevered from the cooling frame 122 with an aperture that allows a fastener to attach the cooling assembly 120 to an external computing component, such as a motherboard. It is contemplated that the cooling assembly 120 can be attached to an external computing component in other ways. The non-limiting example assembly 140 of FIG. 2B illustrates how a fastener feature 138 can be complemented, or replaced, by a clip feature 142 that consists of a flexible protrusion that can be articulated into an aperture to secure the cooling assembly 140. It is contemplated that the cooling frame 122 consists of multiple different types of attachment features, such as features 138 and 142, or multiple separate features of the same type.

Figure 3A:
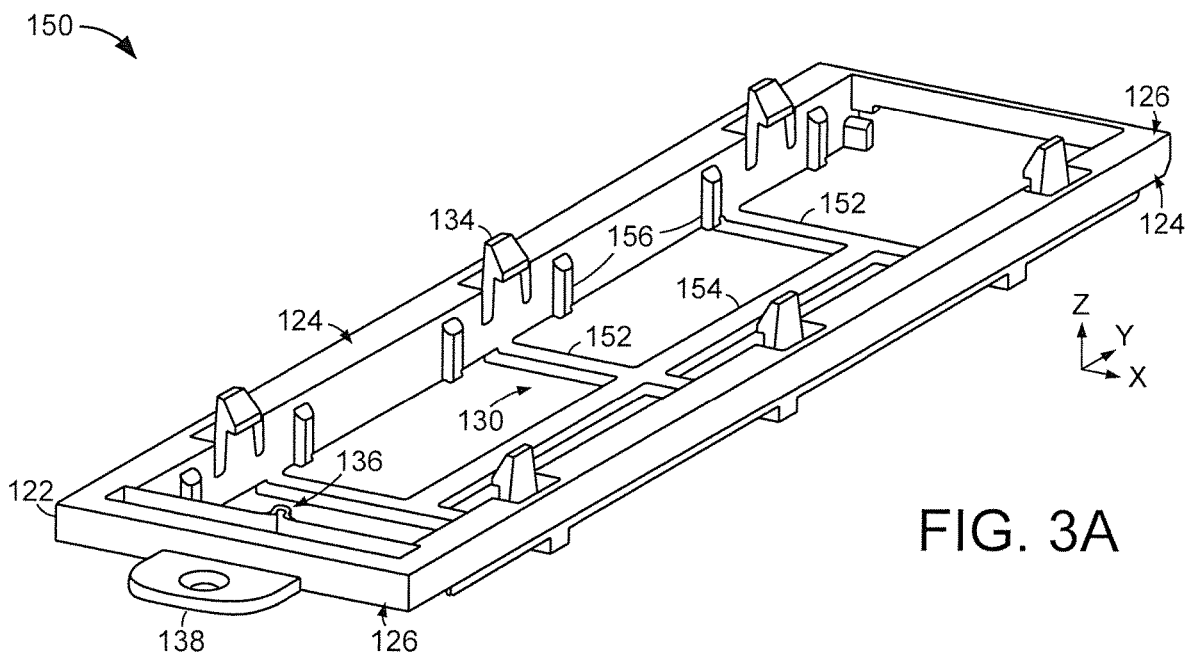
FIGS. 3A-3J respectively illustrate portions of an example memory module cooling assembly arranged in accordance with assorted embodiments.

FIGS. 3A-3J respectively represent various portions of an example memory module cooling assembly 150 constructed and operated in accordance with some embodiments to provide thermal cooling to a memory module. FIG. 3A displays a cooling frame 122 alone to convey one example configuration of the seating tab 130 as a plurality of separated cross-members 152 that each continuously extend between frame side rails 124 with a longitudinal member 154 intersecting the respective cross-members 152. The size, thickness along the Z direction, shape, number, and orientation of the cross-members 152 and longitudinal member 154 can be adjusted to accommodate different amounts of physical support and different numbers of heat sink fins.

The cooling frame 122 has a plurality of separate aligning protrusions 156 that efficiently guide a bottom heatsink 128 into position with respect to the seating tab 130. With the bottom heatsink 128 and memory module 100 removed from the cooling frame 122, the flexible tabs 134 are more clearly shown as cantilevered protrusions that continuously extend from the cooling frame 122 with an open region 158 allowing a tab 134 to be manipulated along the X-Z plane to secure the top heatsink 132 and force physical contact with the memory module 100.

Figure 3B:
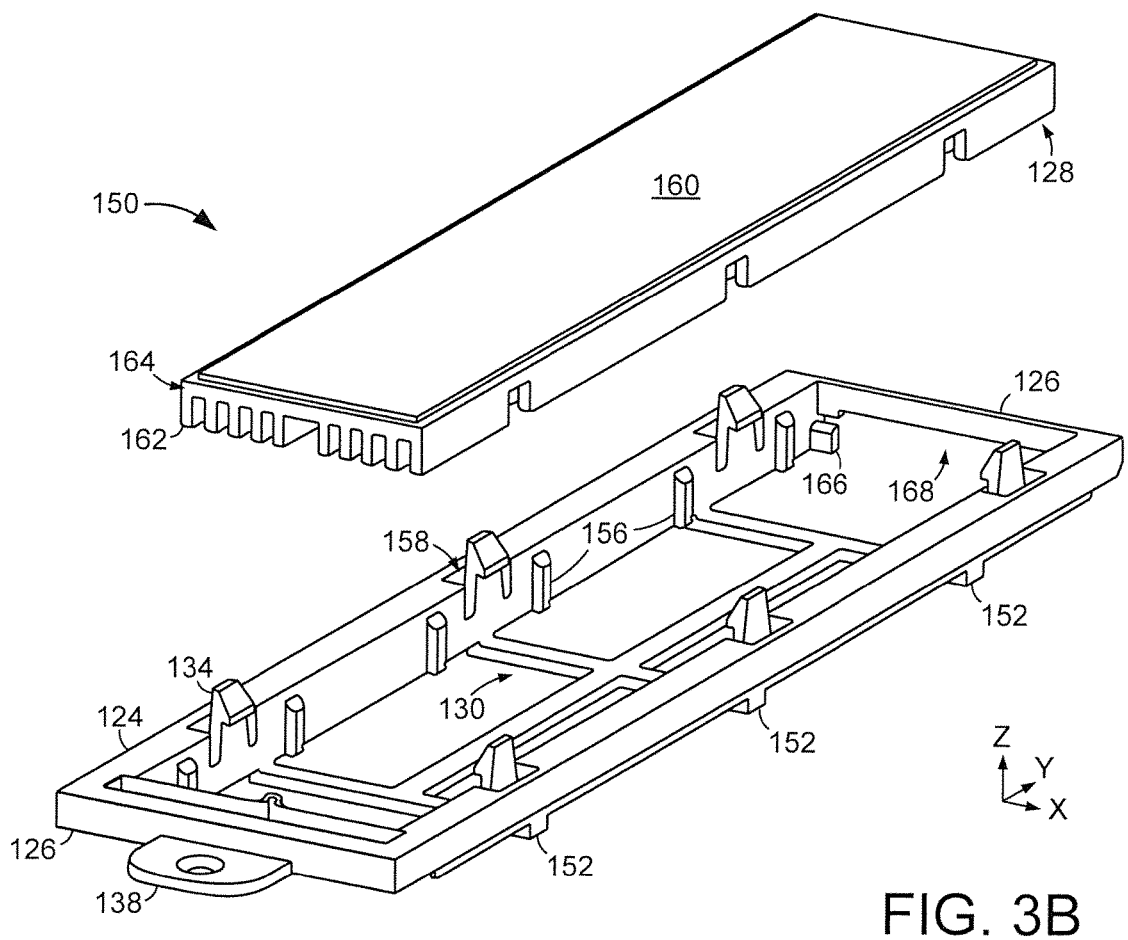

FIG. 3B adds an exploded representation of how the bottom heatsink 128 is oriented with respect to the cooling frame 122 with a cooling layer 160 exposed. The cooling layer 160 may be one or more materials that promote adhesion and/or thermal conductivity between the heatsink 128 and the electrical components 104 of the memory module. In some embodiments, the cooling layer 160 consists of a thermal interface material (TIM) that reduces thermal resistance and increases thermal distribution throughout the bottom heatsink 128. The bottom heatsink 128 has a plurality of fins 162 that respectively protrude from a base 164 to provide an increased amount of surface area compared to a base 164 configuration without fins 162.

Although the fins 162 can increase the cooling capability of the heatsink 128, they can be unstable when used to support the weight of the heatsink 128 in the cooling frame 122. Hence, portions of the bottom heatsink fins 162 are removed to accommodate the seating tab 130. That is, one or more fins 162 are reduced in height so that the cross-members 152 and longitudinal member 154 are positioned between fins 162 and in contact with the heatsink base 164 to securely seat the heatsink 128 to the cooling frame 122. It is contemplated that the cooling fins 162 can have any cross-sectional shape, such as rectangular, square, oval, triangular, or a combination of linear and curvilinear surfaces.

The cooling frame 122 is shaped to accommodate the memory module edge connector 106 with a connector stop 166 in combination with a connector recess 168 portion of a frame end rail 126. The concurrent utilization of the connector stop 166, connector recess 168, and keyed feature 136 physically secures the memory module 100 within the frame 122 and limits memory module 100 movement along horizontal (X-Y plane) and vertical (Z-Y plane) movement, as supported by the physical contact of the aligning tabs 156 with the PCB 102 of the module 100.

Figure 3C:
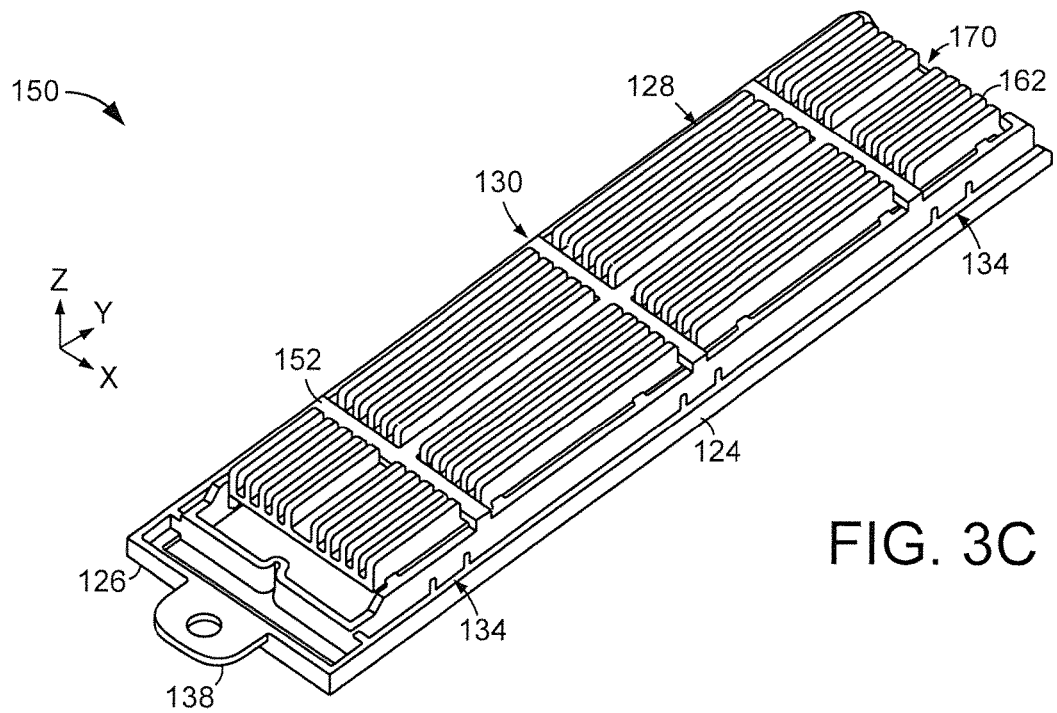

FIG. 3C depicts how the bottom heatsink 128 appears when installed into the cooling frame 122. The bottom view of the cooling assembly 150 in FIG. 3C shows how the seating tab 130 can rest within recesses in the cooling fins 162. In some embodiments, at least one cooling fin 162 extends above the seating tab 130 in the Z direction. In other words, the seating tab 130 can contact the heatsink base 164 and extend to an elevation that is below the height of the respective cooling fins 162, which increases the strength of the attachment of the cooling frame 122 and bottom heatsink 128.

As shown, the heatsink 128 can be adapted with supplemental recesses 170 that are not engaged by the seating tab 130, but allow for different seating tab configurations. That is, not all cooling fin recesses may be occupied by the seating tab 130, which allows the heatsink 128 to be utilized in different cooling frames with differing seating tab 130 configurations. The ability to adapt the bottom heatsink 128 to seat into multiple seating tabs 130 with different configurations reduces the need for multiple different bottom heatsinks to be carried in inventory.

Figure 3D:
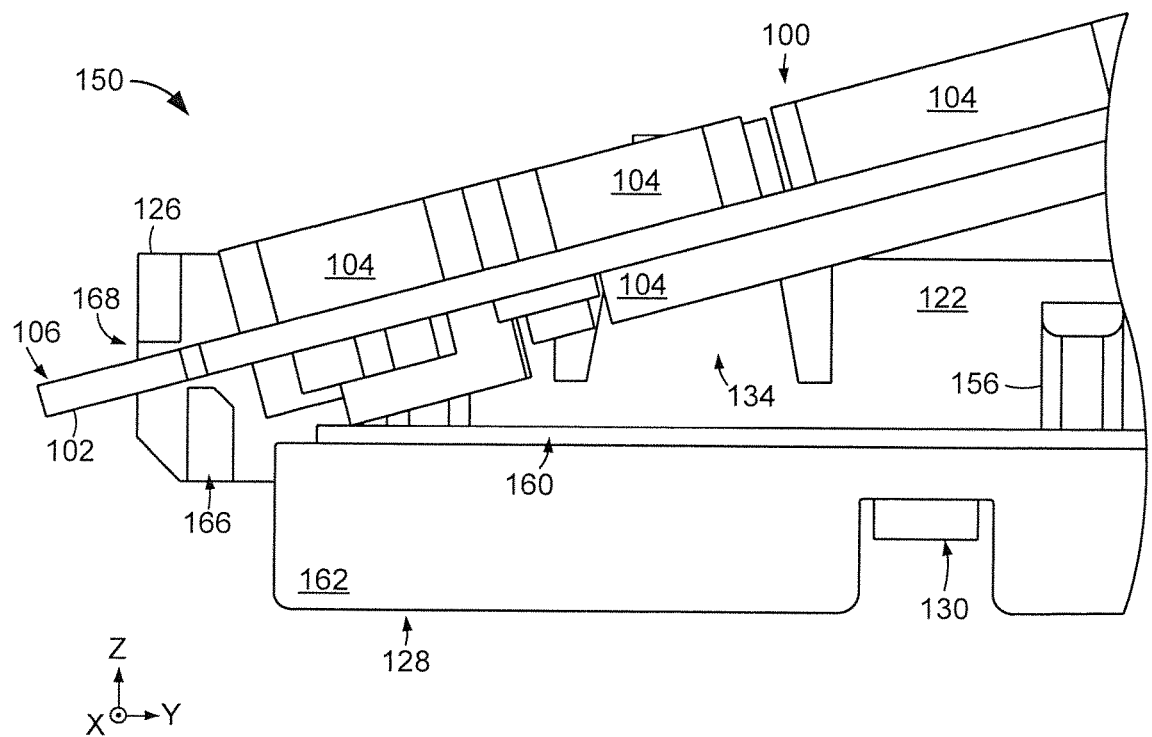

FIG. 3D is a cross-sectional line representation of a portion of the cooling assembly 150 during installation of the memory module 100 after the bottom heatsink 128 is positioned within the cooling frame 122. As shown, the memory module 100 is tilted at a non-normal angle with respect to the Z and Y directions as well as with respect to the cooling frame 122. Such tilt allows the end connector 106 portion of the PCB 102 to engage and extend through the connector recess 168 of the cooling frame 122. Without a static or dynamic tilting of the PCB 102, the end connector 106 would not be able to extend through the connector recess 168 while engaging the cooling layer 160 atop the bottom heatsink 128.

Figure 3E:
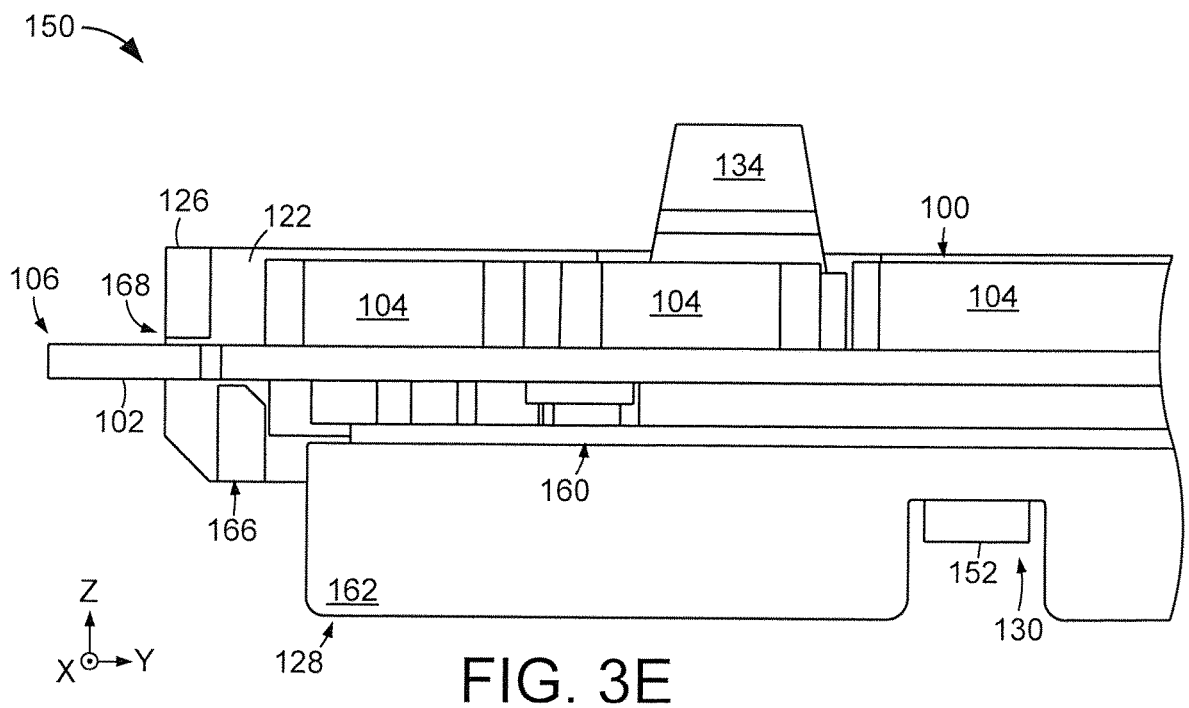

FIG. 3E depicts a cross-sectional view of how the memory module 100 appears after being fully installed into the cooling frame 122, which corresponds with contact with the bottom heatsink 128 either directly or via physical contact with the cooling layer 160. The rotation of the memory module 100 results in complete installation when the end connector 106 resides outside of the cooling frame 122 while the PCB 102 and electrical components 104 reside within the areal extent of the cooling frame 122.

It is noted that the PCB 102 and electrical components 104 are not required to contact the connector stop 168 during installation or after the memory module 100 is positioned within the cooling frame 122. However, the connector stop 168 in combination with the end rail 126 can provide vertical limitations for PCB 102 movement along the Z axis. Likewise, the connector stop 166 can provide a physical limitation along the horizontal (Y axis) direction for the PCB 102 by contacting one or more electrical components 104. It is contemplated that a non-operational component is positioned on the PCB 102 so that it will contact the connector stop 166 before any electrically operable components 104, which can prevent trauma and damage to the operational components 104.

Figure 3F:
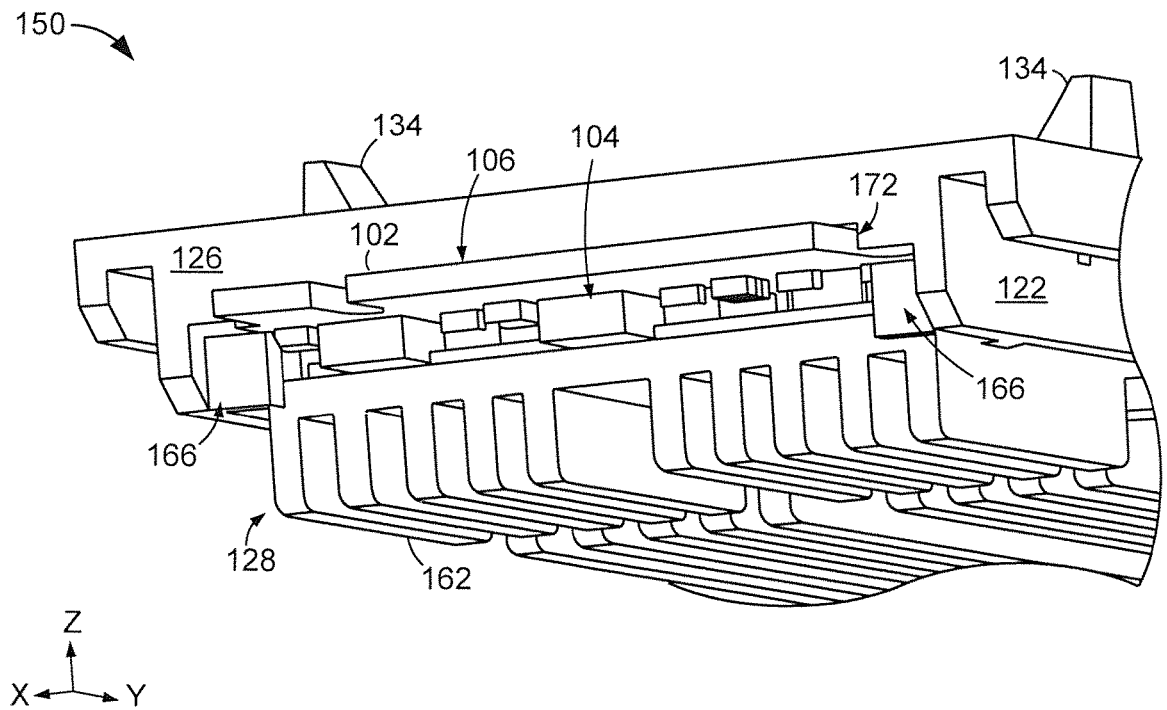

The perspective view line representation of FIG. 3F corresponds with the assembly of FIG. 3E and conveys how the end connector 106 can fit in a notch 172 in the end rail 126 to further provide physical limitations to PCB 102 movement after installation into the cooling frame 122. Although the notch 172 can be any size and shape to accommodate the PCB 102, the reduced end rail thickness notch 172 is not required and the end rail 126 may uniformly extend along the X axis. It is noted that multiple separate connector stops 166 are positioned on opposite lateral sides of the PCB 102, which allows one or more electrical components 104 to continuously extend from the interior of the cooling frame 122 through the connector recess 168.

Figure 3G:
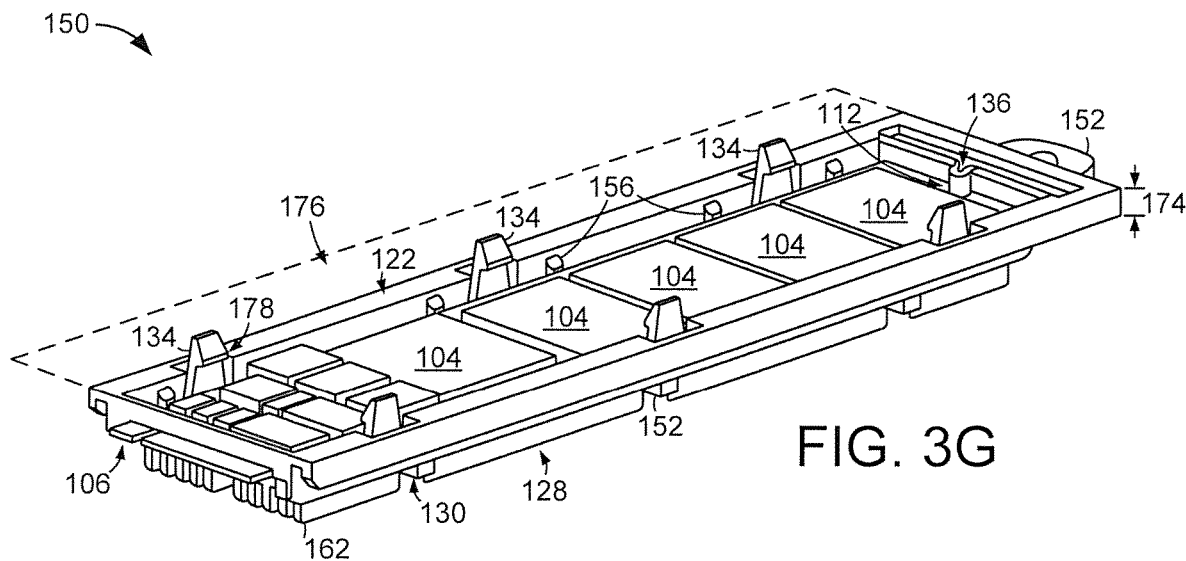

FIG. 3G illustrates how the memory module 100 fits inside the cooling frame 122 when fully installed. The PCB 102 continuously extends through the connector recess 168 on one side of the cooling frame 122 to the keyed feature 136 of the cooling frame 122. That is, the PCB 102 occupies the cooling frame 122 and is held in place after installation by the key region 112 engaging the keyed feature 136, the aligning protrusions 156, the connector stop 166, and the end rail 126. It is not necessary for each aspect of the PCB 102 to contact the assorted portions of the cooling frame 122, but the engagement of any one or more aspects can retain the PCB 102 in a predetermined orientation with the cooling frame 122 and bottom heatsink 128 despite encountered movement, vibration, and shock.

It can be appreciated from FIG. 3G that the cooling frame 122 has a depth 174, along the Z axis, that allows the memory module 100 to reside below the upper plane of the frame, as represented by segmented region 176 parallel to the X-Y plane. That is, the cooling frame 122 is configured so that no electrical component 104 vertically extends above the upper plane of the frame, which is below the retention portion 178 of the respective flexible tabs. Such configuration allows the retention portion 178 to physically contact and secure a portion of the top heatsink 132.

Figure 3H:
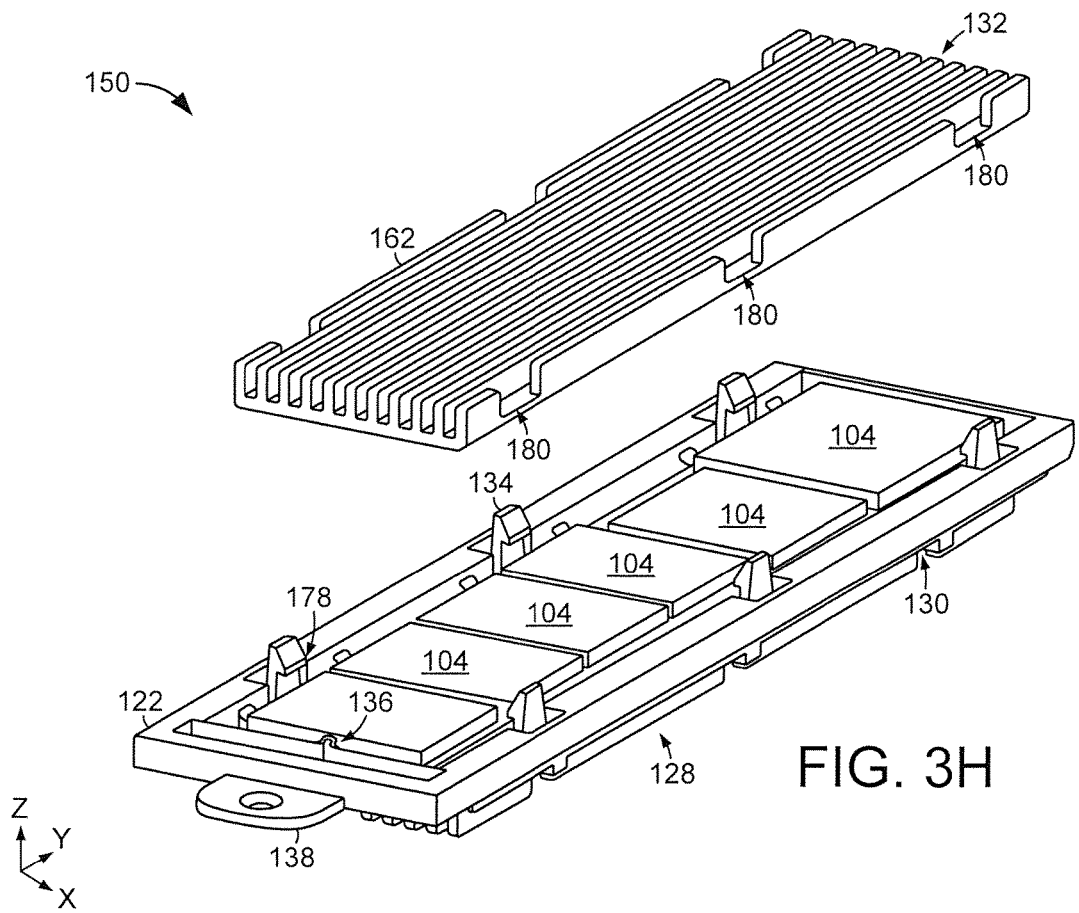

FIG. 3H is an exploded view of how the top heatsink 132 is positioned relative to the assembled cooling frame 122, bottom heatsink 128, and memory module 100. Instead of having recesses in the cooling fins, like those in the bottom heatsink 128 that accommodate the seating tab 130, the top heatsink 132 has retention regions 180 that are notches in the heatsink fins 162. By minimizing the number of recesses in the fins 162 of the top heatsink, greater thermal dissipation can be achieved compared to the bottom heatsink 128.

Although not shown, the interface between the top heatsink 132 and memory module 100 can be coated with a cooling layer that may be similar, or dissimilar to the layer 160 of the bottom heatsink 128. With the different thermal characteristics of the top heatsink 132 compared to the bottom heatsink 128, the cooling layer attached to the top heatsink 132 may have a different thickness, along the Z axis, or may be different material to provide uniform, or exaggeratedly different, thermal gradients on opposite sides of the memory module 100.

As a result of moving the top heatsink 132 into physical contact with the memory module 100 and flexible tabs 134 of the cooling frame 122, the top heatsink 132 is secured and the cooling assembly is complete, as shown in FIGS. 2A & 2B. The assembly of the assorted pieces of the cooling assembly 150 as a singular unitary component can be conducted exclusively by hand and without the aid of tools thanks to the seating of the bottom heatsink 128 in the seating tab 130 the keyed feature 136 engaging the key region 112 while the PCB 102 extends through the connector recess 168, and the contact of the retention portion 178 of each tab 134 with the retention region 180 of the top heatsink 132.

That is, the cooling assembly 150 is tool-less due to no tools being necessary to set the bottom heatsink 128, memory module 100, and top heatsink 132 along with manipulating the flexible tabs 134 to occupy the retention regions 180 of the top heatsink 132. The fully assembled cooling assembly 150 may be dis-assembled by hand without tools by manipulating the flexible tabs 134 and removing the memory module 100 and bottom heatsink 128 from the cooling frame 122.

Figure 3I:
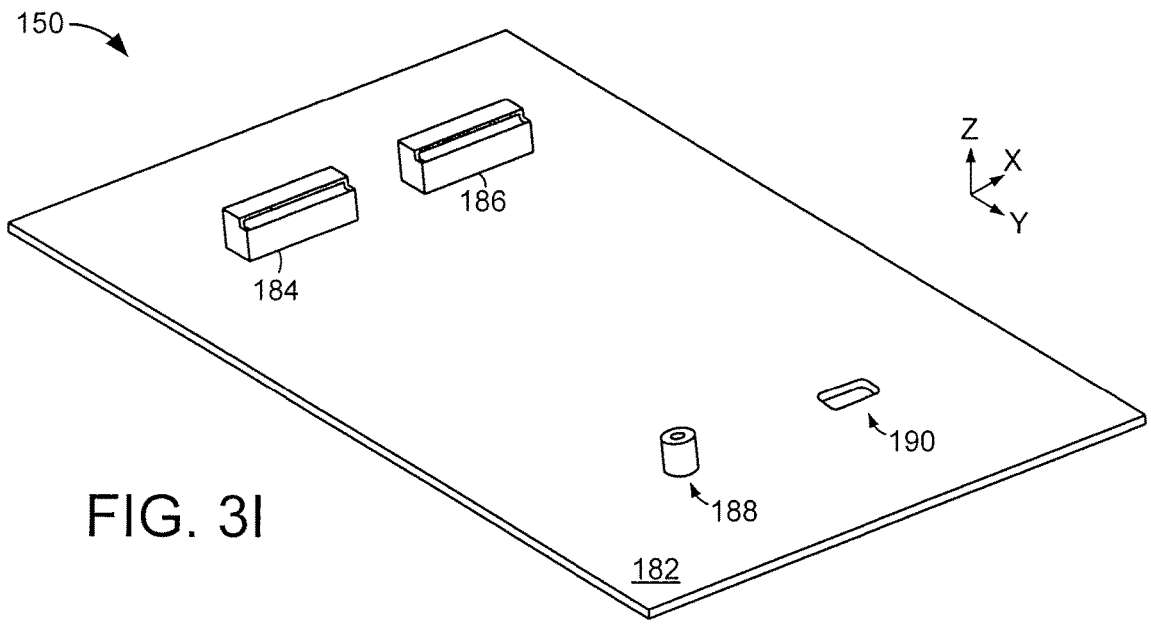

With the cooling assembly 150 being fully assembled, the unit can be employed in a computing system to provide supplemental processing and/or data storage. FIG. 3I displays an example motherboard 182 that can utilize one more cooling assemblies 150 in accordance with various embodiments. The motherboard 182 has first 184 and second 186 connectors that are configured to physically and electrically connect to the end connector 106 of a memory module 100. Hence, the exposed end connector 106 portions of the memory module 100 can be inserted, and removed, from the respective connectors 184/186 to allow the memory module 100 to be activated.

Figure 3J:
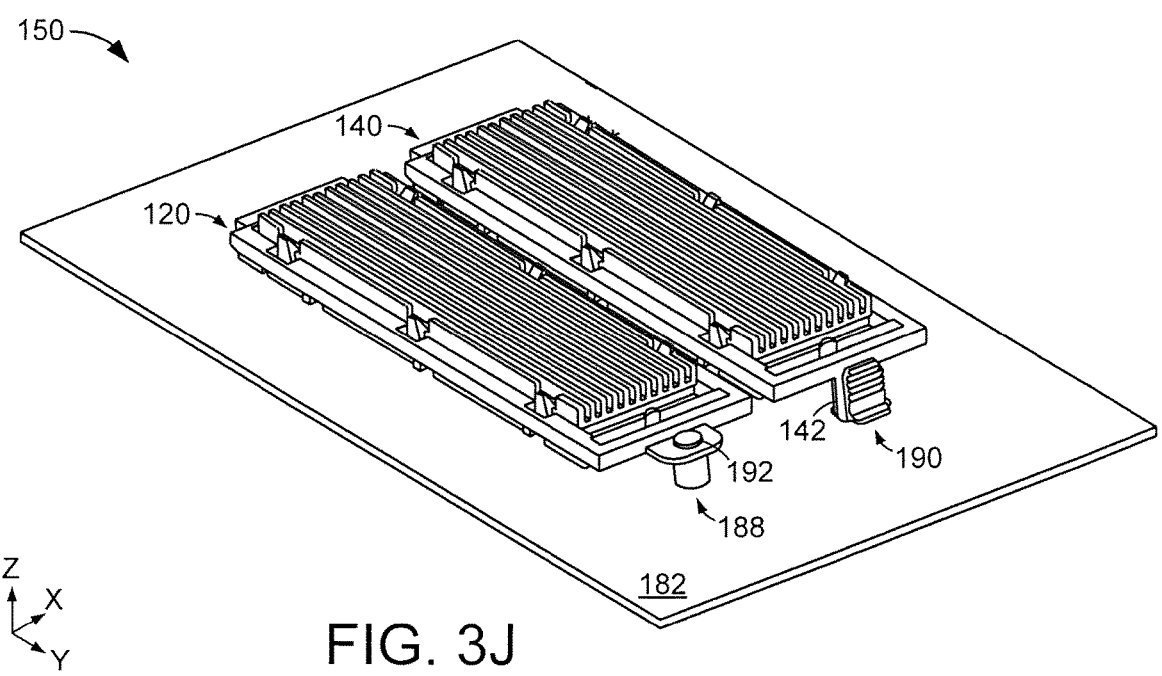

While a cooling assembly 150 may only electrically attach to the motherboard 182 via a connector 184/186, some embodiments physically secure the cooling frame 122 to the motherboard 182 to reduce trauma from movement and vibration. FIG. 3I shows a fastener standoff 188 and a clip aperture 190 that can respectively be engaged by the fastener 138 or clip 142 feature. As shown in FIG. 3J, a fastener 192, such as a hand screw, push pin, or knob, extends through and physically affixes the fastener feature 138 with the fastener standoff 188 to secure the first cooling assembly 120 while the clip feature 142 extends into the clip aperture 190 to secure the second cooling assembly 140. As such, the respective cooling assemblies 120/140 can be individually accessed, removed, and installed by hand and without tools.

Figure 4:
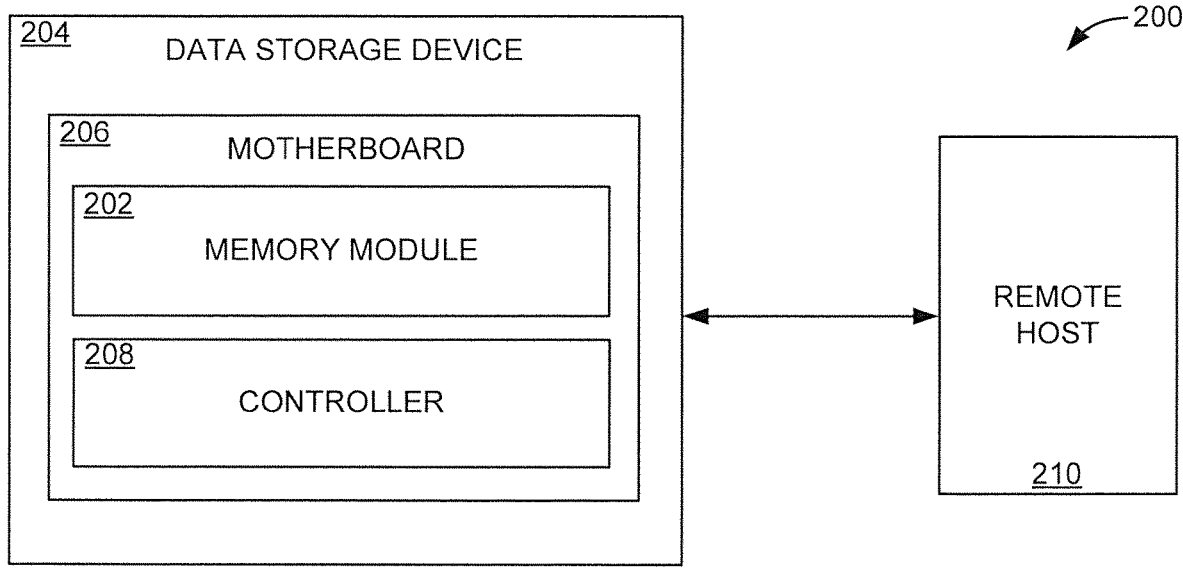
FIG. 4 depicts an example computing system that may employ one or more memory module cooling assemblies.

FIG. 4 displays a block representation of an example computing system 200 that can employ at least one memory module 202 packaged into one or more cooling assemblies 120/140/150. The computing system 200 may have one or more local data storage devices 204 that each has a motherboard 206, such as motherboard 182, that electrically and physically connects to a local controller 208 and at least one memory module 202. The controller 208 may be a microprocessor or programmable processor that can conduct data storage, data generation, and data transfer locally, as well as with one or more remote hosts 210, such as a node, server, or controller, via a wired or wireless network.

With the ability to selectively install, and uninstall, a memory module 202 to the motherboard 206, as illustrated in FIGS. 3I and 3J, the memory module 202 can be moved and modified at will to accommodate different computing needs as well as changing thermal environments. For example, a cooling assembly may have a single heatsink attached to a memory module 202 when first installed in the motherboard 206 and subsequently removed from the motherboard 206 to attach a second heatsink before reinstalling the memory module 202 in the motherboard 206. The configuration of the cooling frame to securely house the memory module 202 with the bottom heatsink by itself and without the top heatsink illustrates the diverse functionality and practicality of the cooling frame without the use or need of a tool.

Figure 5:
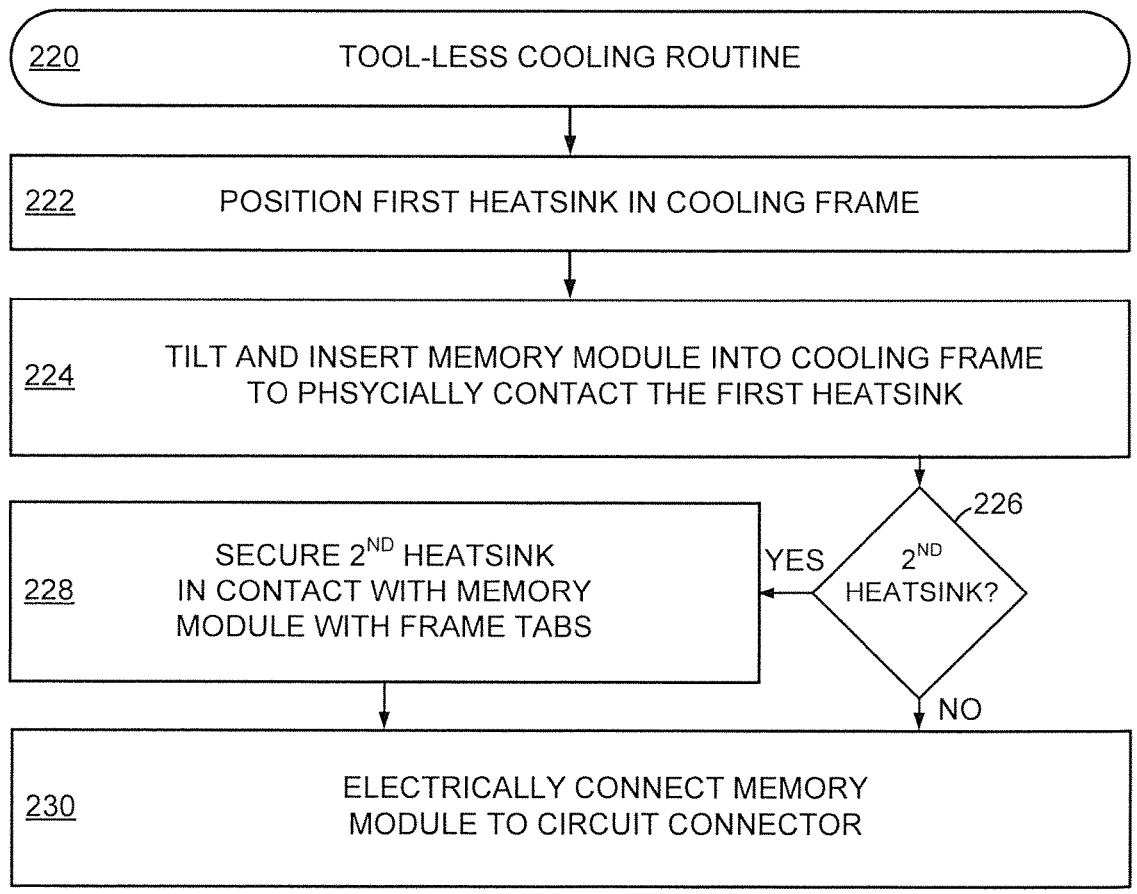
FIG. 5 provides an example tool-less cooling routine that is carried out with the memory module cooling assembly of FIGS. 2A-3J.

FIG. 5 is a tool-less cooling routine 220 that can be carried out in the computing system 200 of FIG. 4 with one or more cooling assemblies 120/140/150 in accordance with some embodiments. With an empty cooling frame, as shown in FIG. 3A, step 222 positions a first heatsink in contact with at least one seating tab of the cooling frame. The first heatsink may have one or more different heatsink fins that can have different shapes and/or sizes. The heatsink fins can define recessed areas of reduced fin thickness that can receive the cooling frame seating tab or be open, such as supplemental recess 170.

It is to be understood that the first heatsink is laterally secured within the cooling frame as a result of step 222, but is vertically unsecured until step 224 inserts a memory module into the cooling frame to contact the first heatsink. Step 224 can involve tilting the memory module to allow the edge connector to pass through the connector recess of the cooling frame before the memory module is rotated to a horizontal orientation, as shown in FIG. 3E, where the first heatsink is contacted directly or via a cooling layer. At the conclusion of step 224, the first heatsink and memory module are each horizontally and vertically secured within the cooling frame, which is aided by the connector stop, aligning protrusions, seating tab, and keyed feature contacting the memory module or heatsink, or both.

The combination of horizontal and vertical stability allows the cooling assembly to fully function without a second heatsink attached to the memory module and cooling frame, which leaves the flexible tabs of the cooling frame open and not contacting a heatsink. However, decision 226 determines if a second heatsink is to be installed in the cooling assembly packaged in step 224. If so, step 228 proceeds to secure a second heatsink to the cooling frame by manipulating at least one flexible tab. When the retention portion of the tab(s) contact the retention region(s) of the second heatsink, the heatsink is thermally and physically connected to the memory module directly, or via a cooling layer.

At the conclusion of step 228, or in the event that the cooling assembly is configured to have only one heatsink from decision 226, step 230 physically and electrically engages the edge connector of the memory module with a circuit connector to incorporate the electrical components of the memory module into the computing system connected to the circuit connector. Once installed, the memory module can be activated, deactivated, and utilized as directed by a local, or remote controller, of the computing system.

Figure 6:
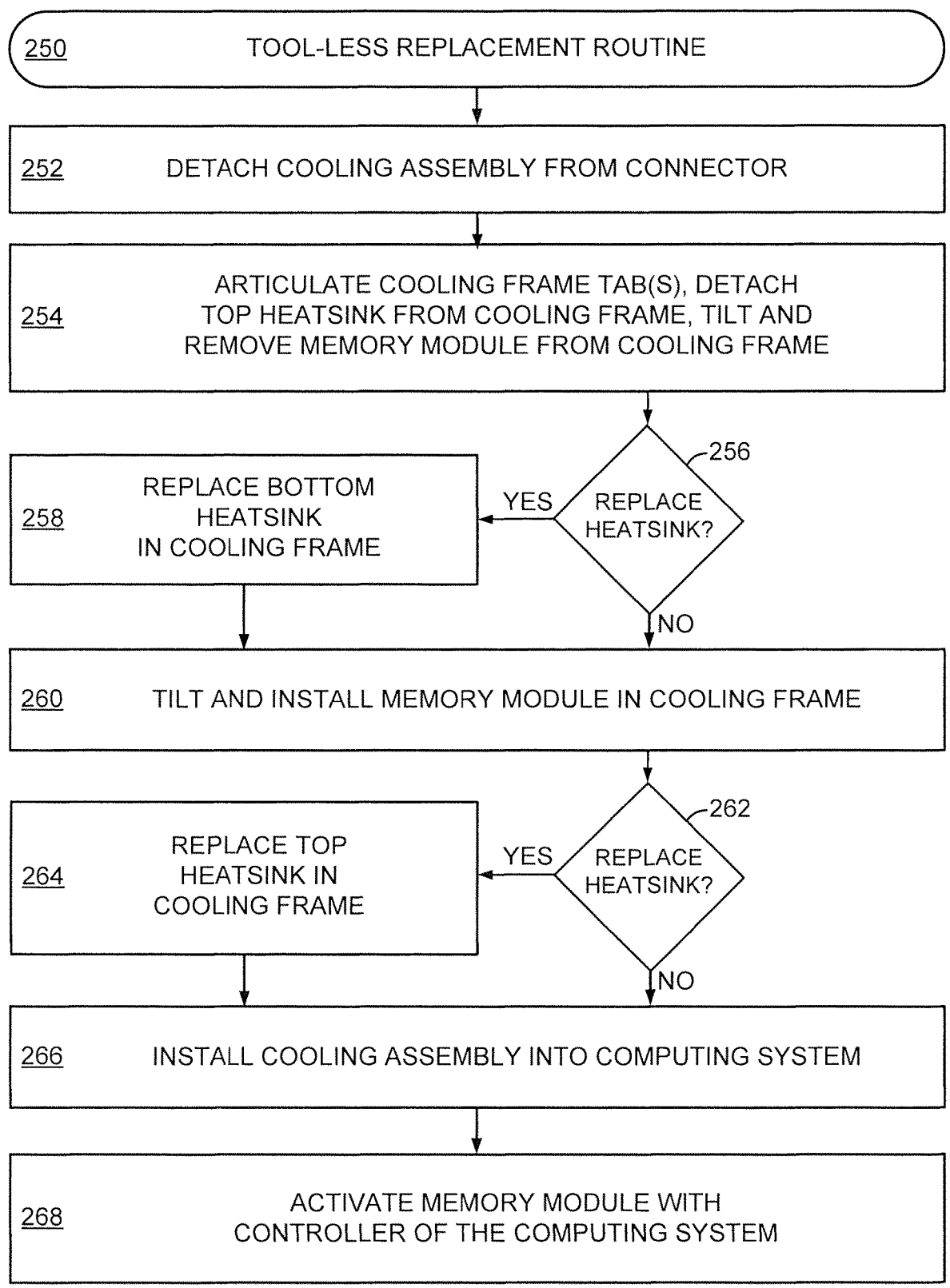
FIG. 6 conveys a tool-less replacement routine that is executed with the memory module cooling assembly of FIGS. 2A-3J.

It is contemplated that the memory module packaged into a cooling assembly and installed in the computing system can remain connected permanently. In yet, replacement of electrical parts can be proactively, or retroactively, conducted. The tool-less replacement routine 250 of FIG. 6 is executed after a cooling assembly is already installed in a computing system. Initially, step 252 detaches a cooling assembly from a computing system connector.

Next, at least one cooling frame flexible tab is articulated in step 254 to remove a top heatsink from the cooling frame prior to the memory module being tilted and removed from the cooling frame. It is noted that portions of step 254 may be skipped in embodiments where the cooling assembly has only a bottom heatsink. With the bottom heatsink exposed, decision 256 evaluates if the bottom heatsink is to be replaced. Replacement may be for any reason, such as damaged fins or to provide a different thermal dissipation profile via a different fin configuration.

Step 258 replaces the bottom heatsink in the cooling frame when prompted by decision 256. If the pre-existing bottom heatsink is to remain, or at the conclusion of step 258, step 260 installs a memory module into the cooling frame. The memory module in step 260 may be the same, or different, than the one removed from the frame in step 254. That is, the memory module can be wholly replaced or individual electrical components of the memory module can be swapped on the pre-existing module PCB.

Securing the memory module into the cooling frame in step 260 triggers decision 262 to evaluate if the top heatsink is to be replaced. Replacement occurs in step 264 and is followed by installation of the packaged cooling assembly into a computing system in step 266. The installation of step 266 can involve electrical connection with a connector as well as physical attachment to a standoff or clip aperture of a printed circuit board, interface card, or motherboard, as shown in FIGS. 3I and 3J. Once the cooling assembly is installed in step 266, step 268 proceeds to activate and utilize the constituent memory module in step 268, as directed by a local, or remote, controller.

By configuring the cooling frame to horizontally and vertically secure two heatsinks and a memory module, installation, service, and cost are reduced. The ability to utilize the cooling frame with one, or both, heatsinks while securing the memory module provides diverse practicality that can optimize service and operation of a computing system, such as through reduced assembly time and inventory. The lack of any specialized, or conventional, tools to assemble, or disassemble, a cooling assembly further optimizes a computing system by increasing safety and service efficiency.

It is noted that the various embodiments of a cooling assembly are not limited to a data storage devices as the technology can readily be utilized in any number of other applications, such as switches, severs, and other electrical closure applications. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:

1. An apparatus comprising a memory module having a printed circuit board physically attached to at least one data storage component attached to a first side of the printed circuit board and at least one data storage component attached to a second side of the printed circuit board, the memory module housed within and contacting a cooling frame surrounding a periphery of the printed circuit board, the cooling frame having a seating tab extending from a first side of the cooling frame to support a first heatsink, the seating tab separated from the memory module, spanning the memory module, and positioned in a recess of the heatsink, a flexible tab positioned within an areal extent of the cooling frame and extending from a second side of the cooling frame to contact a retention region of a second heatsink and secure the second heatsink in contact with the memory module, wherein the printed circuit board continuously extends through a connector recess in the cooling frame, wherein multiple separate connector stops are each positioned opposite the printed circuit board from the connector recess, each connector stop offset from an end rail of the cooling frame to limit horizontal movement of the printed circuit board and second heatsink in a horizontal direction, parallel to a longitudinal axis of the cooling frame.

2. The apparatus of claim 1, wherein the seating tab comprises multiple cross-members intersected by a longitudinal member, the multiple cross-members and longitudinal member each positioned within the recess of the heatsink.

3. The apparatus of claim 1, wherein the memory module has an M.2 standard configuration.

4. The apparatus of claim 1, wherein the cooling frame has a keyed feature extending into a key region of the printed circuit board.

5. The apparatus of claim 1, wherein an edge connector of the memory module resides outside the areal extent of the cooling frame.

6. The apparatus of claim 1, wherein the connector recess comprises a reduced thickness notch in an end rail of the cooling frame.

7. The apparatus of claim 1, wherein the heatsink has a plurality of separated fins extending from a common base.

8. The apparatus of claim 1, wherein the recess is positioned between fins of the heatsink.

9. The apparatus of claim 1, wherein the seating tab continuously extends from a first lateral side of the cooling frame to an opposite second lateral side of the cooling frame.

10. The apparatus of claim 1, wherein the seating tab is positioned below a height of the heatsink.

11. The apparatus of claim 1, wherein the heatsink continuously extends from a first side of the seating tab, proximal the printed circuit board, to a second side of the seating tab, distal the printed circuit board, to nest the seating tab within the recess of the heatsink.

12. A system comprising a memory module having a printed circuit board physically attached to a first data storage component on a first side of the memory module and a second data storage component on a second side of the memory module, the memory module housed within and contacting a cooling frame surrounding a periphery of the printed circuit board, the cooling frame having a seating tab extending from a first side of the cooling frame to support a first heatsink, the seating tab separated from the memory module and spanning the memory module, the cooling frame comprising a flexible tab positioned within an areal extent of the cooling frame and extending from a second side of the cooling frame to secure a second heatsink in contact with the second data storage component, the printed circuit board and first heatsink each contacting a plurality of aligning protrusions each extending from the cooling frame, the second heatsink separated from the plurality of aligning protrusions, a first side of a connector of the printed circuit board contacting a connector stop and a second side of the connector contacting an end rail of the cooling frame, the connector stop and end rail each positioned to limit vertical and horizontal movement of the printed circuit board along directions parallel and perpendicular to a longitudinal axis of the cooling frame.

13. The system of claim 12, wherein the first heatsink has a cooling layer disposed between and contacting a heatsink base and the first data storage component.

14. The system of claim 12, wherein the first and second heatsinks are different.

15. The system of claim 12, wherein the flexible tab engages a retention region of the second heatsink, the retention region having a reduced thickness compared to a cooling fin of the second heatsink.

16. The system of claim 12, wherein the cooling frame limits movement of the first heatsink, memory module, and second heatsink in both horizontal and vertical directions.

17. The system of claim 12, wherein the cooling frame is attached to a motherboard of a computing system via a flexible clip feature.

18. A method comprising:
positioning a first heatsink in a cooling frame, the first heatsink supported by a seating tab extending from a first side of the cooling frame, the seating tab spanning the cooling frame and positioned in a recess of the heatsink;
tilting a memory module at a non-normal angle with respect to the cooling frame, the memory module physically attached to at least one data storage component on a first side of a printed circuit board and at least one data storage component on a second side of the printed circuit board;
inserting the memory module into the cooling frame;
rotating the memory module towards the first heatsink to contact the first heatsink, the cooling frame limiting movement of the first heatsink and memory module along perpendicular axes; and
attaching a second heatsink to a flexible tab positioned within an areal extent of the cooling frame and extending from a second side of the cooling frame, the flexible tab supporting the second heatsink in contact with the at least one data storage component on the second side of the printed circuit board, wherein the printed circuit board continuously extends through a connector recess in the cooling frame, wherein multiple separate connector stops are each positioned opposite the printed circuit board from the connector recess, each connector stop offset from an end rail of the cooling frame to limit horizontal movement of the printed circuit board and second heatsink in a horizontal direction, parallel to a longitudinal axis of the cooling frame.

* * * * *